(12) United States Patent
Kim (10) Patent No.: US 8,207,870 B2
(45) Date of Patent: Jun. 26, 2012

(54) APPARATUS AND METHOD FOR SENSING ROTOR POSITION AND ELECTRIC POWER STEERING SYSTEM USING THE SAME

(75) Inventor: Hyeok Kim, Wonju-si (KR)

(73) Assignee: Mando Corporation, Gyeonggi-Do (KR)

( * ) Notice: Subject to any disclaimer, the term of this patent is extended or adjusted under 35 U.S.C. 154(b) by 59 days.

(21) Appl. No.: 12/873,575

(22) Filed: Sep. 1, 2010

(65) Prior Publication Data

US 2011/0057821 A1 Mar. 10, 2011

(30) Foreign Application Priority Data

Sep. 1, 2009 (KR) ................. 10-2009-0082120

(51) Int. Cl.
*H03M 1/22* (2006.01)
(52) U.S. Cl. ........... 341/11; 180/443; 180/444; 180/446

(58) Field of Classification Search ................ 341/1–17; 180/443, 444, 446
See application file for complete search history.

(56) References Cited

U.S. PATENT DOCUMENTS

| | | | | |
|---|---|---|---|---|
| 7,159,688 B2* | 1/2007 | Onizuka et al. | ............... | 180/444 |
| 7,426,978 B2* | 9/2008 | Onizuka et al. | ............... | 180/444 |
| 2002/0139606 A1* | 10/2002 | Williams et al. | ............... | 180/446 |
| 2011/0057821 A1* | 3/2011 | Kim | ............... | 341/116 |

* cited by examiner

*Primary Examiner* — Lam T Mai
(74) *Attorney, Agent, or Firm* — McDermott Will & Emery LLP

(57) ABSTRACT

An apparatus and method for recognizing a rotor position, and an electric power steering system using the same wherein resolution in rotor position recognition can be improved by software by adding one or more increment values, which is proportional to the rotation speed of a rotor, in an interval where the counted number of increment pulses of a pulse generator is not changed in sampling the counted number of increment pulses of the pulse generator so as to recognize a rotor position of a motor.

7 Claims, 5 Drawing Sheets

APPARATUS AND METHOD FOR SENSING ROTOR POSITION AND ELECTRIC POWER STEERING SYSTEM USING THE SAME

BACKGROUND OF THE INVENTION

1. Field of the Invention

The present invention relates to an apparatus and method for sensing a rotor position and an electric power steering system using the same. More particularly, the present invention relates to an apparatus and method for sensing a rotor position, and an electric power steering system using the same wherein resolution in rotor position recognition can be improved by software by adding an increment value, which is proportional to the rotation speed of a rotor, in an interval where the counted number of increment pulses of a pulse generator is not changed in sampling the counted number of increment pulses of the pulse generator so as to recognize a rotor position of a motor.

2. Description of the Prior Art

As generally known in the art, an EPS (Electric Power Steering) system drives a motor, through an ECU (Electronic Control Unit), depending on a driving condition of a vehicle determined by a vehicle speed sensor, a steering angle sensor, a steering torque sensor, etc., in such a manner that the EPS system imparts, at the time of low-speed driving, light and convenient steering feeling, and at the time of high-speed driving, heavy steering feeling and good directional stability to a driver, whereby the driver can be provided with the optimal steering condition.

The above-mentioned electric power steering system is configured in such a manner that a motor is installed in the outside of a steering column to be capable of rotating a steering shaft positioned within the steering column, wherein the steering column is interposed between steering wheel and a gear box so as to transmit force applied by the driver for rotating the steering wheel to a lower side. As a result, the electric power steering system is adapted to support the driver's steering force according to the steering of the steering wheel.

Figure 1:
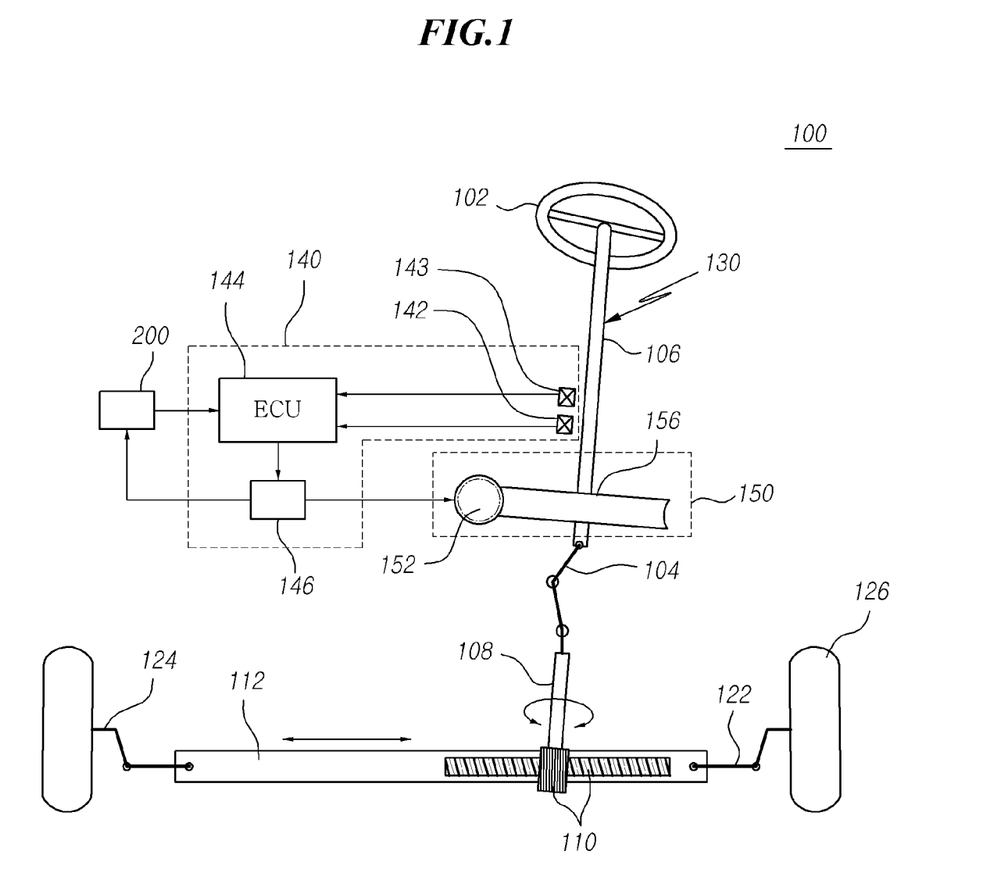
FIG. 1 is a schematic view of an electric power steering machine.

FIG. 1 is a schematic view of an electric power steering system.

As shown in FIG. 1, the electric power steering system 100 includes a steering network 130 extending from a steering wheel 102 to left and right front wheels 126, and an auxiliary power mechanism 140 for supplying steering support power to the steering network 130.

The steering network 130 includes a steering shaft 106, one end of which is connected to the steering wheel 102 to be rotated with the steering wheel 102, and the other end of which is connected to a pinion shaft 108 through a pair of universal joints 104. In addition, the pinion shaft 108 is connected to a rack bar 112 through a rack and pinion mechanism 110, and the opposite ends of the rack bar 112 are connected to the wheels 126 of the vehicle through tie rods 122 and knuckle arms 124.

The auxiliary power mechanism 140 includes a torque sensor 142 for sensing torque applied to the steering wheel 102 by the driver and outputting an electric signal proportional to the sensed torque, an angle sensor 143 for outputting an electric signal which is proportional to the rotated angle of the steering wheel, an electronic control unit 144 for generating a control signal on the basis of the electric signals transmitted from the torque sensor 142 and the angle sensor 143, a motor 146 for generating auxiliary power on the basis of the control signal transmitted from the electronic control unit 144, and a speed reducer 150 having a worm gear 152 and a worm wheel gear 156 so as to transmit the auxiliary power generated by the motor to the steering shaft 106.

A function for precisely sensing the rotor position of the motor is required when the ECU of the EPS drives the motor, and the rotor position is sensed using an absolute position sensor for the rotor and a pulse generator.

Figure 2:
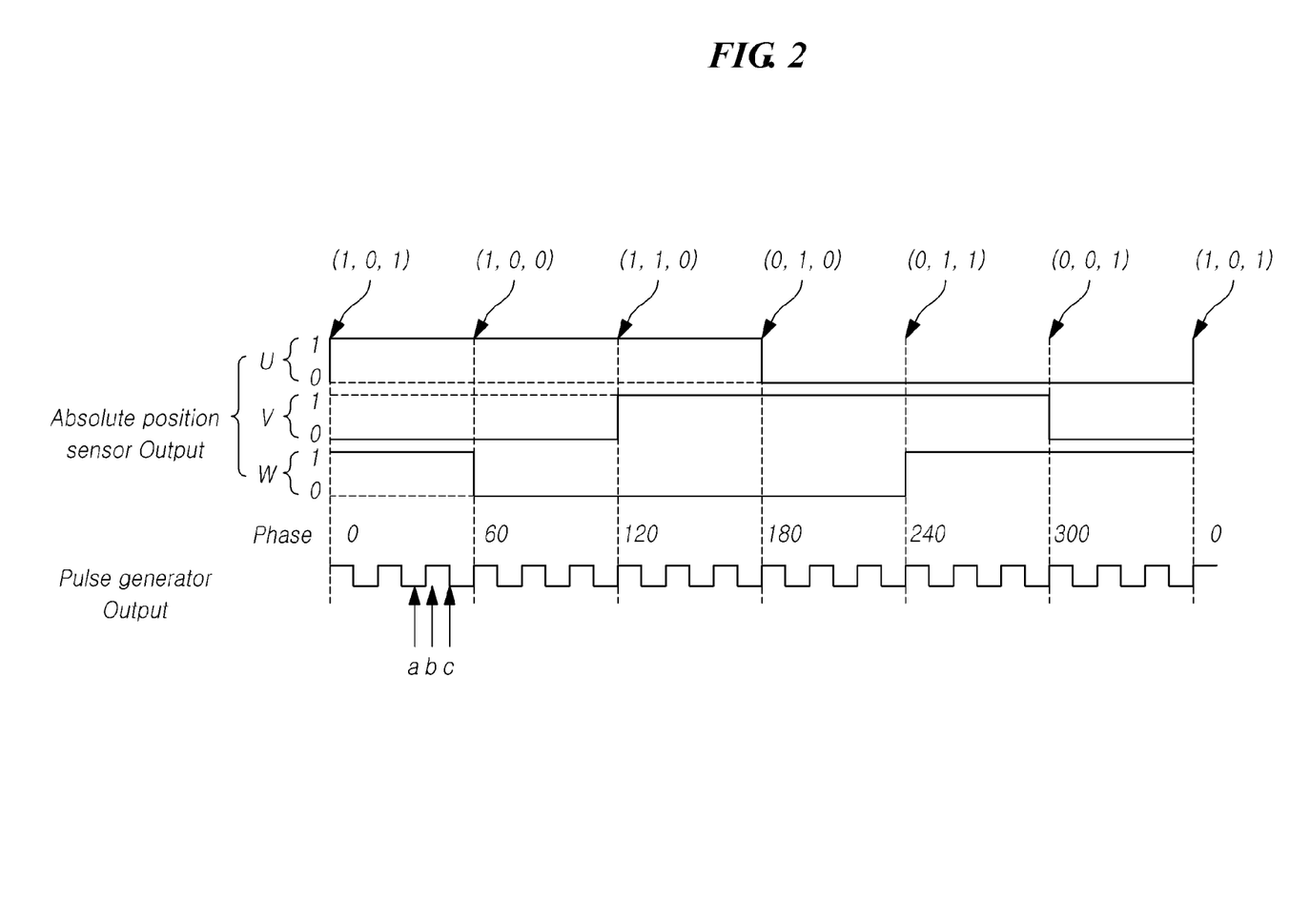
FIG. 2 exemplifies output of an absolute position sensor and output of a pulse generator.

FIG. 2 exemplifies output of an absolute position sensor and output of a pulse generator.

Referring to FIG. 2, the absolute position sensor of a 3-phase motor is divided into six sections by an absolute position sensor for each of U, V and W phases, and the pulse generator generates N increment pulses per one period of the absolute position sensor, wherein "N" means the number of increment pulses.

In the past, the rotor position was calculated using only absolute position information and the number of increment pulses counted in synchronization with the absolute position information. Each time when the number of increment pulses is increased by one (1), the rotor position is renewed. In accordance with this method, if a sampling period is set in such a manner that sampling for sensing the position of the rotor is executed several times within one period of the increment pulses, no change may be caused in sampling value even if the rotor is rotated.

For example, assuming that the number of increment pulses is counted at rising edges of the increment pulses in FIG. 2, there is a problem in that if sampling is executed at time points a, b and c, the sampling value is changed between the time point a and the time point b because the counted number of increment pulses is changed but between the time point b and the time point c, the rotor position is sensed as being unchanged because the number of counted increment pulses is not changed.

In addition, if the motor is controlled by the above-mentioned method, a problem arises in that harmonic noise corresponding to N times of the number of mechanical rotations of the rotor is produced, thereby producing noise sounds.

SUMMARY OF THE INVENTION

Accordingly, the present invention has been made to solve the above-mentioned problems occurring in the prior art, and an object of the present invention is to provide a an apparatus and method for recognizing a rotor position, and an electric power steering system using the same wherein resolution in rotor position recognition can be improved by software by adding one or more increment values, which is proportional to the rotation speed of a rotor, in an interval where the counted number of increment pulses of a pulse generator is not changed in sampling the counted number of increment pulses of the pulse generator so as to recognize a rotor position of a motor.

In order to accomplish this object, there is provided an apparatus for sensing a rotor position including: an absolute position sensor for sensing absolute position information for a rotor; a pulse generator for generating increment pulses with a predetermined period; a rotor position estimating unit for calculating the rotor position using the absolute position information and the number of the increment pulses counted in synchronization with the absolute position information at the time of sampling, wherein the rotor position estimating unit re-calculates the calculated rotor position by adding one or more increment values to the number of the increment pulses if the number of the increment pulses equals to the number of increment pulses at the time of just previous sampling; and an output unit for generating a signal having information concerning the calculated rotor position or the re-calculated rotor position, wherein the increment value is proportional to the rotor rotation speed and the sampling period.

The rotor position estimating unit re-calculates the rotor position if the rotor rotation speed exceeds a preset speed even if the number of the increment pulses is equal to the number of increment pulses at the time of just previous sampling.

In accordance with another aspect of the present invention, there is provided a method for sensing a rotor position including the steps of: sensing absolute position information for a rotor; generating increment pulses with a predetermined period; sensing the number of increment pulses counted in synchronization with the absolute position information; calculating the rotor position using the absolute position information and the number of the increment pulses; re-calculating the calculated rotor position by adding one or more increment values to the number of the increment pulses if the number of the increment pulses equals to the number of increment pulses at the time of just previous sampling; and generating a signal having information concerning the calculated rotor position or the re-calculated rotor position, wherein the increment value is proportional to the rotor rotation speed and the sampling period.

In accordance with another aspect of the present invention, there is provided an electric power steering system including: an absolute position sensor for sensing absolute position information for a rotor of a motor; a pulse generator for generating increment pulses with a predetermined period; a rotor position estimating unit for calculating the rotor position using the absolute position information and the number of the increment pulses counted in synchronization with the absolute position information at the time of sampling, wherein the rotor position estimating unit re-calculates the calculated rotor position by adding an increment value to the number of the increment pulses if the number of the increment pulses equals the number of increment pulses at the time of just previous sampling; and an output unit for generating a signal having information concerning the calculated rotor position or the re-calculated rotor position, wherein the increment value is proportional to the rotor rotation speed and the sampling period.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. In the following description and drawings, it shall be noted that the same reference numerals are used to designate the same or similar components, and so repetition of the description on the same or similar components will be omitted. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

Figure 3:
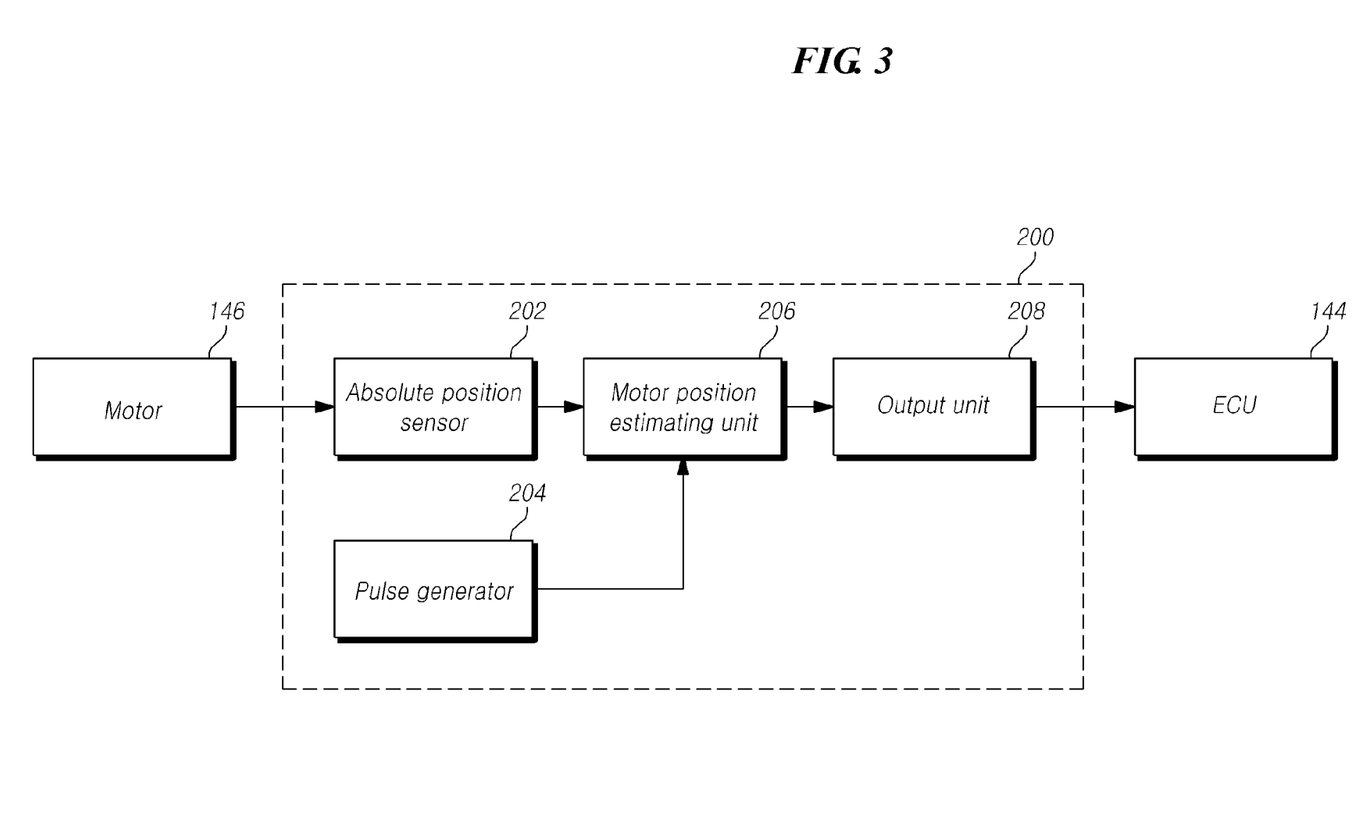
FIG. 3 shows a rotor position sensing apparatus in accordance with an embodiment of the present invention.

FIG. 3 shows a rotor position sensing apparatus in accordance with an embodiment of the present invention.

As shown in FIG. 3, the rotor position sensing apparatus includes an absolute position sensor 202, a pulse generator 204, a rotor position estimating unit 206, and an output unit 208.

The absolute position sensor 202 recognizes absolute position information concerning a 3-phase motor. As shown in FIG. 2, the absolute position information means a value obtained by dividing position recognition information for U, V and W phases into six (6) sections. That is, the absolute position information is one of (1,0,1), (1,1,0), (0,1,0), (0,1,1), (0,0,1) and (1,0,1).

The pulse generators increment pulses with a predetermined period.

At the time of sampling, the rotor position estimating unit 206 calculates a rotor position using the absolute position information and the number of increment pulses counted in synchronization with the absolute position information. If the number of the increment pulses equals the number of increment pluses at the time of pre-sampling, the rotor position estimating unit 206 calculates the calculated rotor position by adding one or more increment values to the calculated rotor position. Here, the increment value is proportional to the rotor rotation speed and the sampling period, and may be expressed as Equation 1 below.

$$\text{Increment value} = \text{rotor rotation speed} * \text{sampling period} \quad \text{Equation 1}$$

Thus, the rotor position may be expressed as Equation 2 below.

$$\begin{aligned}\text{Rotor position} = &(\text{rotor position calculated using the} \\ &\text{number of increment pulses counted in synchro-}\\ &\text{nization with absolute position information}) + \\ &\text{rotor rotation speed} * \text{sampling period}\end{aligned} \quad \text{Equation 2}$$

The rotor position estimating unit 206 may newly count the number of increment pulses by resetting the number of increment pulses at each period of the absolute position sensor 202. However, in the present embodiment, it is assumed that the rotor position estimating unit 206 resets and newly counts the number of increment pulses each time when the absolute position is changed.

The output unit 208 may generate and output the calculated rotor position to an apparatus, such as an ECU.

Figure 4:
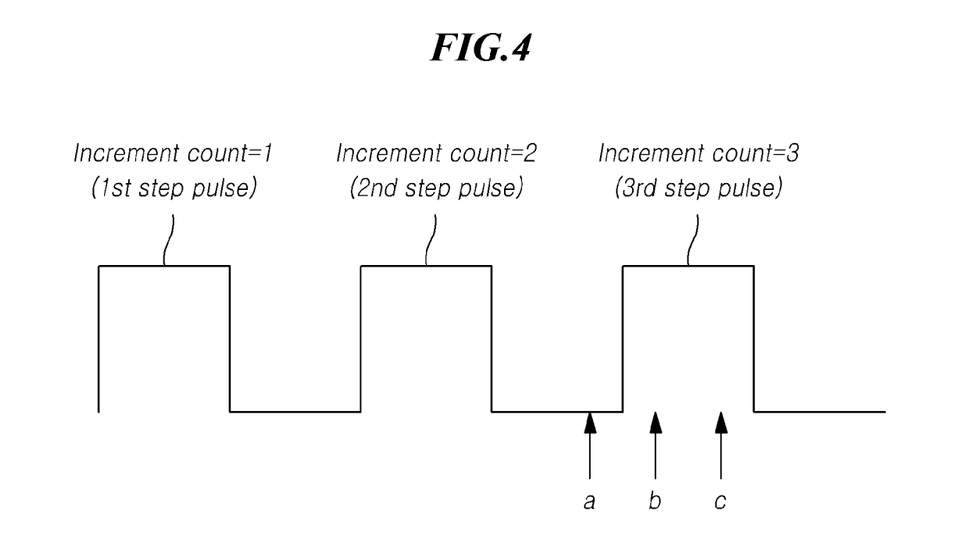
FIG. 4 shows the sampling-executed part in FIG. 2 in an enlarged scale.

FIG. 4 shows the sampling-executed part in an enlarged scale.

Hereinafter, a motor position sensing apparatus and method in accordance with the present embodiment will be described with reference to FIGS. 2 to 4.

As shown in FIG. 2, a position sensor for a rotor of a 3-phase motor typically has absolute position information divided into six (6) sections by an absolute position sensor 202 for each of U, V and W phases, and the rotor position estimating unit 206 calculates the rotor position information of the 3-phase motor, using the absolute information pulses, wherein the pulse generator 204 generates N pulses per each rotation of the rotor.

If sampling for sensing a rotor position is executed at time points a, b and c as shown in FIG. 2, the sampling value at the time point b is different from that at the time point a because the output of the pulse generator 204 is changed between the time point a and the time point b. Meanwhile, the sampling in the present invention means extracting the absolute position information and the number of increment pulses counted in synchronization with the absolute position information.

Since the current sampling value for the number of increment pulses at the time point b is different from the just previous sampling value (that is, the counted value of increment pulses is varied), the rotor position value calculated by the absolute position sensor 202 and the number of increment pulses is not changed.

However, since the counted number of increment pulses is not changed between the time point b and the time point c, the current sampling value for the number of increment pulses at the time point c is equal to the just previous sampling value. Thus, the rotor position is calculated by adding the increment value expressed by Equation 1 to the rotor position value calculated using the number of increment pulses counted in synchronization with the absolute position information.

For example, if the increments of the pulse generator 204 are changed 48 steps per one rotation of electric angle of the rotor, and the rotor presents the speed of 4500 rpm with reference to electric angle, the time period required for increasing the increment pulses one (1) step is 277 µs. If sampling for the rotor position is executed every 69.3 µs, sampling is executed four (4) times per one (1) step of output of the increment pulses of the pulse generator 204.

Therefore, it is possible to calculate the increment value in rotor position between each sampling interval by multiplying the rotor's rotation speed by the sampling period.

Therefore, the rotor position, that is calculated using only the absolute position and the number of increment pulses counted in synchronization with the absolute information (hereinafter, the rotor position is referred to as first rotor position), is a value obtained by adding an angle corresponding to a two step value of the increment pulses of the pulse generator 204 to the angle, 0° corresponding to a section value of the absolute position sensor, (1,0,1), wherein since the value corresponding one step value for the increment pulses is) 7.5° (360/48=7.5°, the angle corresponding to the two step value for the increment pulses is 15° (7.5°*2=15°). Thus, the first rotor position at the time point c is 15°. In addition, since sampling is executed four times per step, the increment value at the time point c is 1.875° (7.5/4=1.875°). Thus, by adding the increment value to the first rotor position, the current rotor position becomes 16.875° (0°+15°+1.875°32 16.875°.

As a result of calculating the rotor position obtained by calculating the accumulated increment value in the current step of the increment pulse output, if it is determined that the calculated rotor position value exceeds the rotor position value at the step next to the outputting of the pulse generator 204, the accumulated increment value is set such that it cannot exceed a preset limit. That is, if the increment value is accumulated at the time of sampling, thereby exceeding 7.5°, a limit is set in such a manner that the accumulated increment value cannot exceed 7.5°.

Meanwhile, if the rotation speed of electric angle of the rotor is below the preset speed, it is possible to omit the calculation of increment value. If the rotation speed of the rotor is low, a lot of noises occur in position sensing using the absolute position sensor 202 and the increment pulses of the pulse generator 204 at the time of rotor position sensing through the sampling for the rotor. Therefore, since it is practically useless to calculate the increment value, it is possible to omit the calculation of increment value. That is, even if the number of increment pulses is equal to that of the just previous sampling, the rotor position estimating unit 206 re-calculates the rotor position if the rotor's rotation speed exceeds the preset speed.

Figure 5:
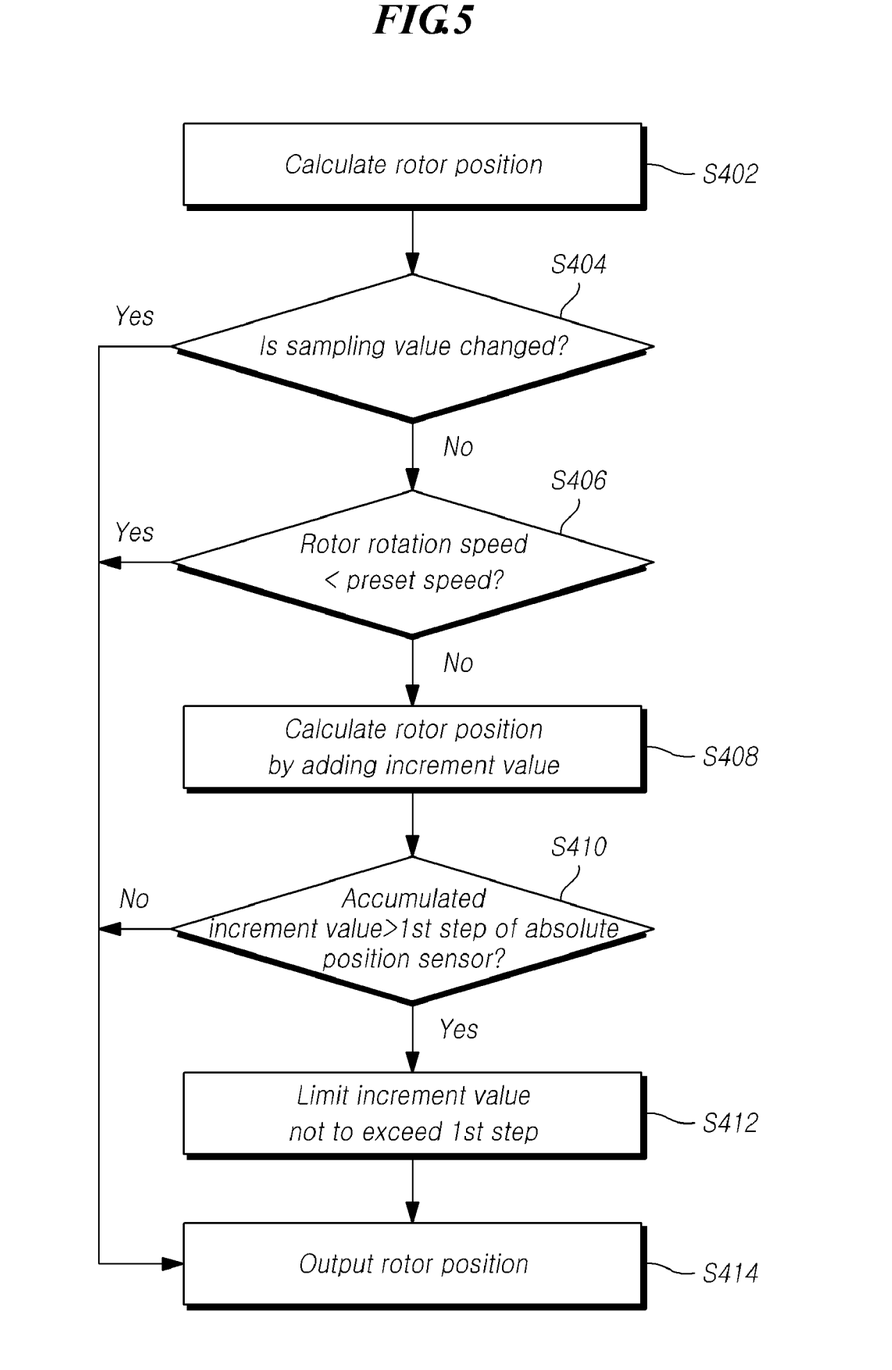
FIG. 5 shows a flowchart for a rotor position sensing method in accordance with an embodiment of the present invention.

FIG. 5 is a flowchart showing a rotor position sensing method in accordance with an embodiment of the present invention.

As shown in FIG. 1, the rotor position sensing method in accordance with an embodiment of the present invention firstly calculates the rotor position on the basis of the absolute position information of the absolute position sensor 202 and the number of the increment pulses of the pulse generator 204 (S402). It is confirmed whether the current sampling value for the number of increment pulses is different from the just previous sampling value (S404). If it is determined that the current and just previous sampling values are different from each other, the rotor position calculated in step S402 (S404), and if it is determined that the sampling values are equal to each other, it is confirmed whether the rotor's rotation speed is lower than the preset speed (S406).

If it is determined that the rotor rotation speed is lower that the preset speed, the rotor position calculated in step S402 is output (S414) (S414), and if the rotor rotation speed is not lower than the preset speed, the rotor position is calculated by additionally adding the increment valued expressed by Equation 1 to the rotor position value calculated in step S402 (S408).

At this time, the accumulated increment value for the increment pulses at the current step is calculated and it is confirmed whether the accumulated increment value exceeds one step value for the increment pulses (S410), and if it is determined that the accumulated increment value exceeds the one step value, the rotor position is output by setting the accumulated increment value such that it cannot exceed the preset limit (S414). If the accumulated increment value does not exceed the one step value, the rotor position calculated in step S408 is output (S414).

FIG. 1 is a schematic view of an electric power steering system in accordance with an embodiment of the present invention.

As shown in FIG. 1, the electric power steering system 100 in accordance with an embodiment of the present invention includes a steering network 130 extending from a steering wheel 102 to left and right front wheels 126, and an auxiliary power mechanism 140 for supplying steering support power to the steering network 130.

The steering network 130 includes a steering shaft 106, one end of which is connected to the steering wheel 102 to be rotated with the steering wheel 102, and the other end of which is connected to a pinion shaft 108 through a pair of universal joints 104. In addition, the pinion shaft 108 is connected to a rack bar 112 through a rack and pinion mechanism 110, and the opposite ends of the rack bar 112 are connected to the wheels 126 of the vehicle through tie rods 122 and knuckle arms 124.

The auxiliary power mechanism 140 includes a torque sensor 142 for sensing torque applied to the steering wheel 102 by the driver and outputting an electric signal which is proportional to the sensed torque, an angle sensor 143 for outputting an electric signal proportional to the rotated angle of the steering wheel 102, an electronic control unit 144 for generating a control signal on the basis of the electric signals transmitted from the torque sensor 142 and the angle sensor 143, a motor 146 for generating auxiliary power on the basis of the control signal transmitted from the electronic control unit 144, and a speed reducer 150 having a worm gear 152 and a worm wheel gear 156 so as to transmit the auxiliary power generated by the motor 146 to the steering shaft 106.

When the electronic control unit 144 drives the motor 146, a function for precisely sensing the rotor position of the motor 146 is required, and the rotor position is sensed using a rotor position sensing apparatus 200 in accordance with an embodiment of the present invention.

As described above, according to the present invention, resolution in rotor position recognition can be improved by software by adding an increment value, which is proportional to the rotation speed of a rotor, in an interval where the counted number of increment pulses of a pulse generator is not changed in sampling the counted number of increment pulses of the pulse generator so as to recognize a rotor position of a motor.

Even if it was described above that all of the components of an embodiment of the present invention are coupled as a single unit or coupled to be operated as a single unit, the present invention is not necessarily limited to such an embodiment. That is, among the components, one or more components may be selectively coupled to be operated as one or more units. In addition, although each of the components may be implemented as an independent hardware, some or all of the components may be selectively combined with each other, so that they can be implemented as a computer program having one or more program modules for executing some or all of the functions combined in one or more hardwares. Codes and code segments forming the computer program can be easily conceived by an ordinarily skilled person in the technical field of the present invention. Such a computer program may implement the embodiments of the present invention by being stored in a computer readable storage medium, and being read and executed by a computer. A magnetic recording medium, an optical recording medium, a carrier wave medium, or the like may be employed as the storage medium.

In addition, since terms, such as "including," "comprising," and "having" mean that one or more corresponding components may exist unless they are specifically described to the contrary, it shall be construed that one or more other components can be included. All of the terminologies containing one or more technical or scientific terminologies have the same meanings that persons skilled in the art understand ordinarily unless they are not defined otherwise. A term ordinarily used like that defined by a dictionary shall be construed that it has a meaning equal to that in the context of a related description, and shall not be construed in an ideal or excessively formal meaning unless it is clearly defined in the present specification.

Although some preferred embodiments of the present invention have been described for illustrative purposes, those skilled in the art will appreciate that various modifications, additions and substitutions are possible, without departing from the scope and spirit of the invention as disclosed in the accompanying claims. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. An apparatus for sensing a rotor position, comprising:
   an absolute position sensor for sensing absolute position information for a rotor;
   a pulse generator for generating increment pulses with a predetermined period;
   a rotor position estimating unit for calculating the rotor position using the absolute position information and the number of the increment pulses counted in synchronization with the absolute position information at the time of sampling, wherein the rotor position estimating unit re-calculates the calculated rotor position by adding one or more increment values to the number of the increment pulses if the number of the increment pulses equals the number of increment pulses at the time of just previous sampling; and
   an output unit for generating a signal having information concerning the calculated rotor position or the re-calculated rotor position, wherein the increment value is proportional to the rotor rotation speed and the sampling period.

2. The apparatus as claimed in claim 1, wherein the increment value is obtained by multiplying the rotor rotation speed and the sampling period.

3. The apparatus as claimed in claim 1, wherein the rotor position estimating unit re-calculates the rotor position if the rotor rotation speed exceeds a preset speed even if the number of the increment pulses is equal to the number of increment pulses at the time of just previous sampling.

4. An electric power steering system comprising:
   an absolute position sensor for sensing absolute position information for a rotor of a motor;
   a pulse generator for generating increment pulses with a predetermined period;
   a rotor position estimating unit for calculating the rotor position using the absolute position information and the number of the increment pulses counted in synchronization with the absolute position information at the time of sampling, wherein the rotor position estimating unit re-calculates the calculated rotor position by adding one or more increment values to the number of the increment pulses if the number of the increment pulses equals the number of increment pulses at the time of just previous sampling; and
   an output unit for generating a signal having information concerning the calculated rotor position or the re-calculated rotor position, wherein the increment value is proportional to the rotor rotation speed and the sampling period.

5. The system as claimed in claim 4, wherein the increment value is obtained by multiplying the rotor rotation speed and the sampling period.

6. The system as claimed in claim 4, wherein the rotor position estimating unit re-calculates the rotor position if the rotor rotation speed exceeds a preset speed even if the number of the increment pulses is equal to the number of increment pulses at the time of just previous sampling.

7. A method for sensing a rotor position, comprising the steps of:
sensing absolute position information for a rotor;
generating increment pulses with a predetermined period;
sensing the number of increment pulses counted in synchronization with the absolute position information;
calculating the rotor position using the absolute position information and the number of the increment pulses;
re-calculating the calculated rotor position by adding one or more increment values to the number of the increment pulses if the number of the increment pulses equals to the number of increment pulses at the time of just previous sampling; and
generating a signal having information concerning the calculated rotor position or the re-calculated rotor position, wherein the increment value is proportional to the rotor rotation speed and the sampling period.

* * * * *